United States Patent [19]
Spaziani et al.

[11] Patent Number: 5,631,571
[45] Date of Patent: May 20, 1997

[54] INFRARED RECEIVER WAFER LEVEL PROBE TESTING

[75] Inventors: Stephen Spaziani, Nashua, N.H.; Kenneth Vaccaro, Acton; William Waters, Bedford, both of Mass.

[73] Assignee: The United States of America as represented by the Secretary of the Air Force, Washington, D.C.

[21] Appl. No.: 626,870

[22] Filed: Apr. 3, 1996

[51] Int. Cl.$^6$ .................. G01R 31/28; G01R 31/26; G01R 19/00
[52] U.S. Cl. .................. 324/752; 324/658; 374/73.1
[58] Field of Search .................. 324/752, 753, 324/490, 71.3, 658

[56] References Cited

U.S. PATENT DOCUMENTS

| | | | |
|---|---|---|---|
| 3,832,019 | 8/1974 | Alessi | 308/3 |
| 4,563,642 | 1/1986 | Munakata et al. | 324/752 |
| 4,627,151 | 12/1986 | Mulholland et al. | 29/569 |
| 4,685,998 | 8/1987 | Quinn et al. | 156/633 |
| 4,722,060 | 1/1988 | Quinn et al. | 364/490 |
| 4,755,746 | 7/1988 | Mallory | 324/158 |
| 4,845,425 | 7/1989 | Beha et al. | 324/752 |
| 5,157,327 | 10/1992 | Henley | 324/752 |
| 5,170,127 | 12/1992 | Henley | 324/658 |
| 5,381,103 | 1/1995 | Edmond et al. | 324/753 |
| 5,412,330 | 5/1995 | Ravel et al. | 324/753 |

*Primary Examiner*—Kenneth A. Wieder
*Assistant Examiner*—Barry C. Bowser
*Attorney, Agent, or Firm*—Gerald B. Hollins; Thomas L. Kundert

[57] ABSTRACT

A system for functionally testing opto-electronic devices, such as fiber-optic infrared receiver photodiodes, in the integral wafer or other optical port-exposed status. The testing arrangement uses a portable optical probe for communicating optical signals between the testing apparatus and the tested device in coincidence with electrical energization and functional operation of the electro-optical device by the test apparatus. The optical probe signals may be correlated in time relationship or other manner with the electrical signals applied-to the device-under-test. The invention provides simple conversion between a conventional electrical semiconductor device probe station and an electro-optical device probe station.

18 Claims, 3 Drawing Sheets

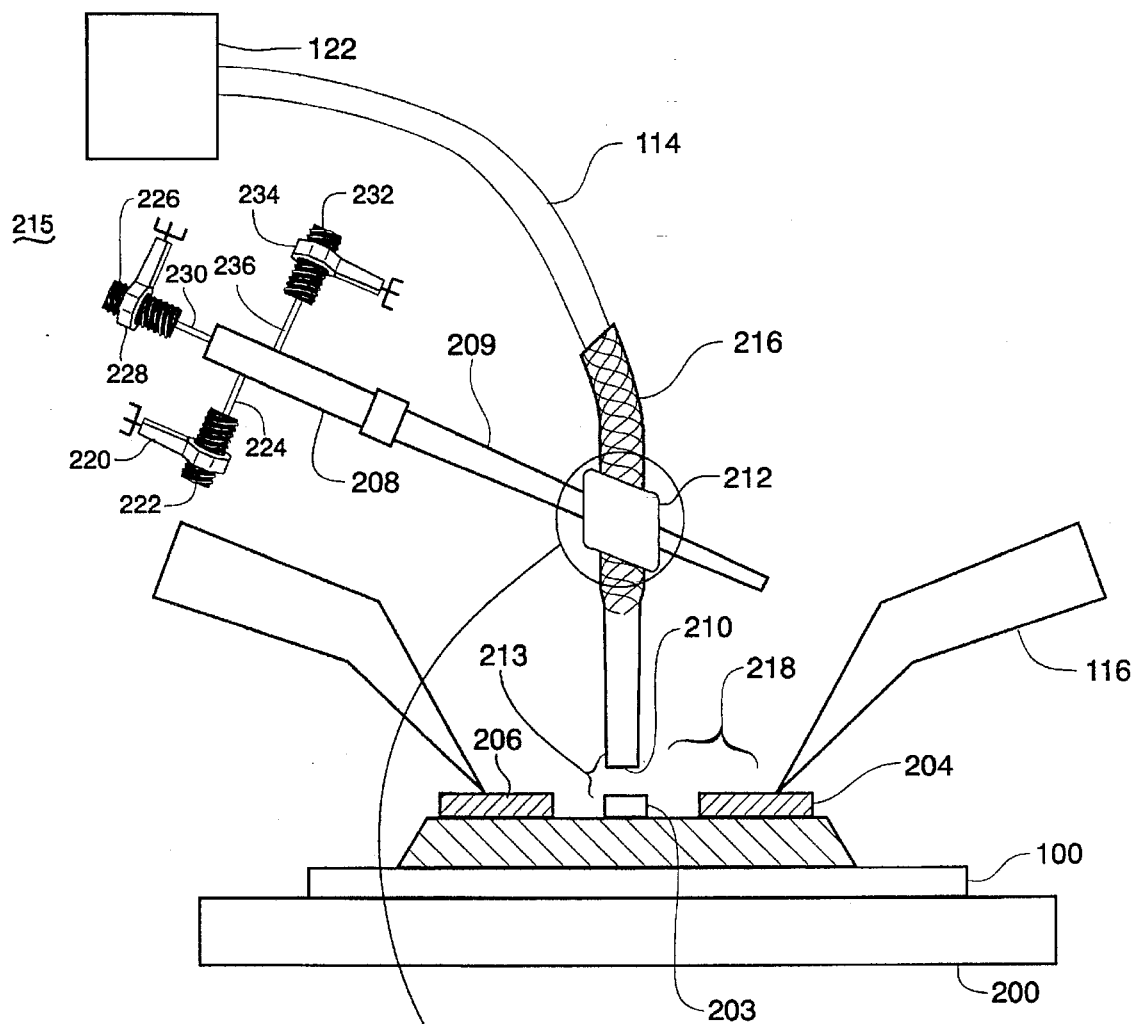
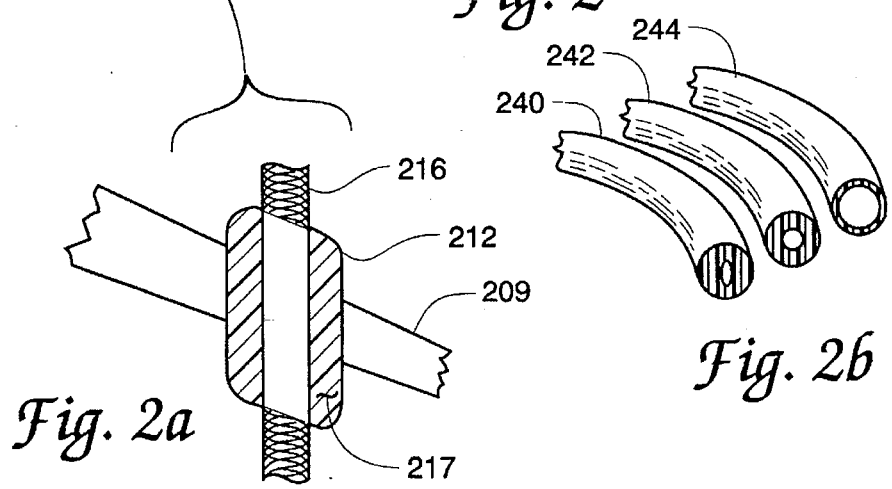
Fig. 2
Fig. 2a
Fig. 2b

INFRARED RECEIVER WAFER LEVEL PROBE TESTING

RIGHTS OF THE GOVERNMENT

The invention described herein may be manufactured and used by or for the Government of the United States for all governmental purposes without the payment of any royalty.

BACKGROUND OF THE INVENTION

This invention relates to the field of electro-optical integrated circuit die testing in the integral or whole wafer state of device fabrication.

Even though probe testing of integral wafer-contained circuit die for electrical properties has been a matter of routine accomplishment for years there remains some degree of difficulty in extending this test capability to electro-optical devices, devices which involve both electrical and optical or radiant energy signals as well as involving electrical signals. Devices of this nature may be referred to as signal transducer devices and generally include the charge coupled device or CCD family, the phototransistor, light responsive switching devices, and the photodiode, for examples. Testing of a combined electrical and optical nature may also be of value in evaluating the performance of some purely electrical signal-operated devices i.e., conventional transistor devices, which are subjected to unusual and light-inclusive operating conditions since photon-responsive characteristics are inherent in most transistors. The optical signal communication provided by the present invention is usable over a wide range of such devices and their test conditions.

The U.S. Patent art indicates the presence of considerable inventive activity relating to the fields of opto-electronic device and circuit die testing. The invention of Ravel et al, in U.S. Pat. No. 5,412,330 is for example of general interest with respect to such testing in the sense that it discloses use of a probe member, precise position control of test apparatus and optically communicated signals in the course of testing electro-optical material. The thrust of the Ravel et al. Invention appears however, to be in the area of substituting optical signals for electrical connection to a device-under-test.

Patents of background interest with respect to the present invention also include the patent of Alessi, U.S. Pat. No. 3,832,019, which is concerned with a three axis slide-inclusive micropositioning apparatus for testing integrated circuit devices. The thrust of the Alessi invention appears to be in the area of the mechanical slide apparatus.

Previous integrated circuit wafer testing patents also include the patent of Mallory, U.S. Pat. No. 4,755,746, a patent which is concerned with performance of sheet resistance measurements on a semiconductor wafer. The Mallory testing arrangement includes use of optical signals however, the invention appears not to be concerned with the probe testing of completed integrated circuit dice.

The previous integrated circuit testing patents also include a series of related patents assigned to Mostek Corporation of Carrolton Texas, patents which are concerned with the assembling and testing of integrated circuit devices. These patents include U.S. Pat. No. 4,722,060 and U.S. Pat. No. 4,685,998. The use of "a fiber-optic pigtail" to communicate optical signals between electrical devices located on a common integrated circuit wafer is indicated to be a possible "variation" of the disclosed apparatus in this series of patents.

The previous circuit testing patents also include the patent of Edmond et al., U.S. Pat. No. 5,381,103 which is concerned with accelerated degradation testing of a semiconductor device and with a combination optical and electrical measurement arrangement for measuring performance of the device-under-test. The Edmond apparatus in addition to this accelerated testing is primarily concerned with the application of large amplitude electrical signals to light emitting devices.

SUMMARY OF THE INVENTION

The present invention provides for the convenient combined electrical and optical testing of integral wafer-received opto-electronic devices, devices which have not yet been separated into individual dice.

It is an object of the present invention therefore, to provide a combined electrical and optical test of an opto-electronic device.

It is an object of the present invention therefore to provide for the functional testing of a fiber-optic photodiode electro-optical receiver device with a combination of optical energy signals and electrical signals.

It is another object of the invention, to provide a combined electrical and optical test of a nonpackaged opto-electronic device.

It is another object of the invention to provide such testing while the device-under-test is yet contained in integral-wafer form in an array of similar devices.

It is another object of the invention to provide such testing while the device-under-test is in a variety of different nonoptically obscured status conditions.

It is another object of the invention to provide an optical probe apparatus wherein an optical signal communication node of a probe apparatus can be accurately positioned with respect to the circuit device-under-test.

It is another object of the invention to provide an optical probe wherein an optical signal node of the probe apparatus can be accurately positioned with respect to an angular orientation of an optical input port of a circuit device-under-test.

It is another object of the invention to provide an optical probe wherein an optical signal output node of the probe can be accurately positioned with respect to an optical signal input node of a circuit device-under-test.

It is another object of the invention to provide an optical probe which may be used in performing a variety of tests on an opto-electronic device-under-test, tests which include frequency response and speed, spectral response and pulse response characteristics.

It is another object of the invention to provide an optical probe which is capable of communicating optical signals to a device-under-test by way of a final media path which may include atmospheric media, an optical coupling fluid or a nonplanar termination of the probe conductor.

It is another object of the invention to provide a wafer probe station that is capable of accomplishing either an electrical signal test or an optical signal test or a combination of such tests.

It is another object of the invention to provide a wafer probe station that is capable of accomplishing such tests in a convenient and factory production-capable manner.

It is another object of the invention to provide an electro-optical die test arrangement that is compatible with the vacuum chuck and fixed probe apparatus found in common present day usage.

Additional objects and features of the invention will be understood from the following description and claims and the accompanying drawings.

These and other objects of the invention are achieved by the method of probe testing integral wafer-contained infrared fiber-optic receiver photodiode inclusive circuit die comprising the steps of:

disposing a to-be-tested circuit die into engagement with an array of precisely positioned electrical probe elements located around a circuit die-receiving aperture of a probe card test apparatus;

energizing said to be tested circuit die electrically through said array of electrical probe elements as required for functional operation;

supplying electrical input port signals and electrical output port loading to said circuit die through said array of electrical probe elements as needed for functional operation;

disposing an external signal-communicating optical node in a precise physical position location and orientation with respect to said array of electrical probe elements, said circuit die-receiving aperture and a selected optical input port region of said to-be-tested circuit die;

communicating nonpolarized infrared optical energy signals from a testing apparatus-energized external transducer element through a fiber-optic communication path to said optical node and thence by a short media path to said optical input port region of said to-be-tested circuit die;

controlling an optical signal communicated between said external transducer apparatus and said circuit die optical port from within said testing apparatus;

evaluating electrical signals communicated from said circuit die to said testing apparatus via said array of electrical probe elements, in response to received optical and electrical signals, against expected die performance criteria;

moving said aperture and said wafer with respect to each other until a next to be tested circuit die on said wafer is precisely located within said aperture and in physical registration with said electrical probe elements and said signal-communicating optical node.

BRIEF DESCRIPTION OF THE DRAWINGS

FIG. 2 shows a more detailed view of the device-under-test and the optical signal path elements of FIG. 1.

FIG. 2a shows a more detailed partial cross section view of one area in FIG. 2.

FIG. 2b shows a more detailed partial cross section view of several different optical fibers usable in FIG. 2.

DETAILED DESCRIPTION

Figure 1:
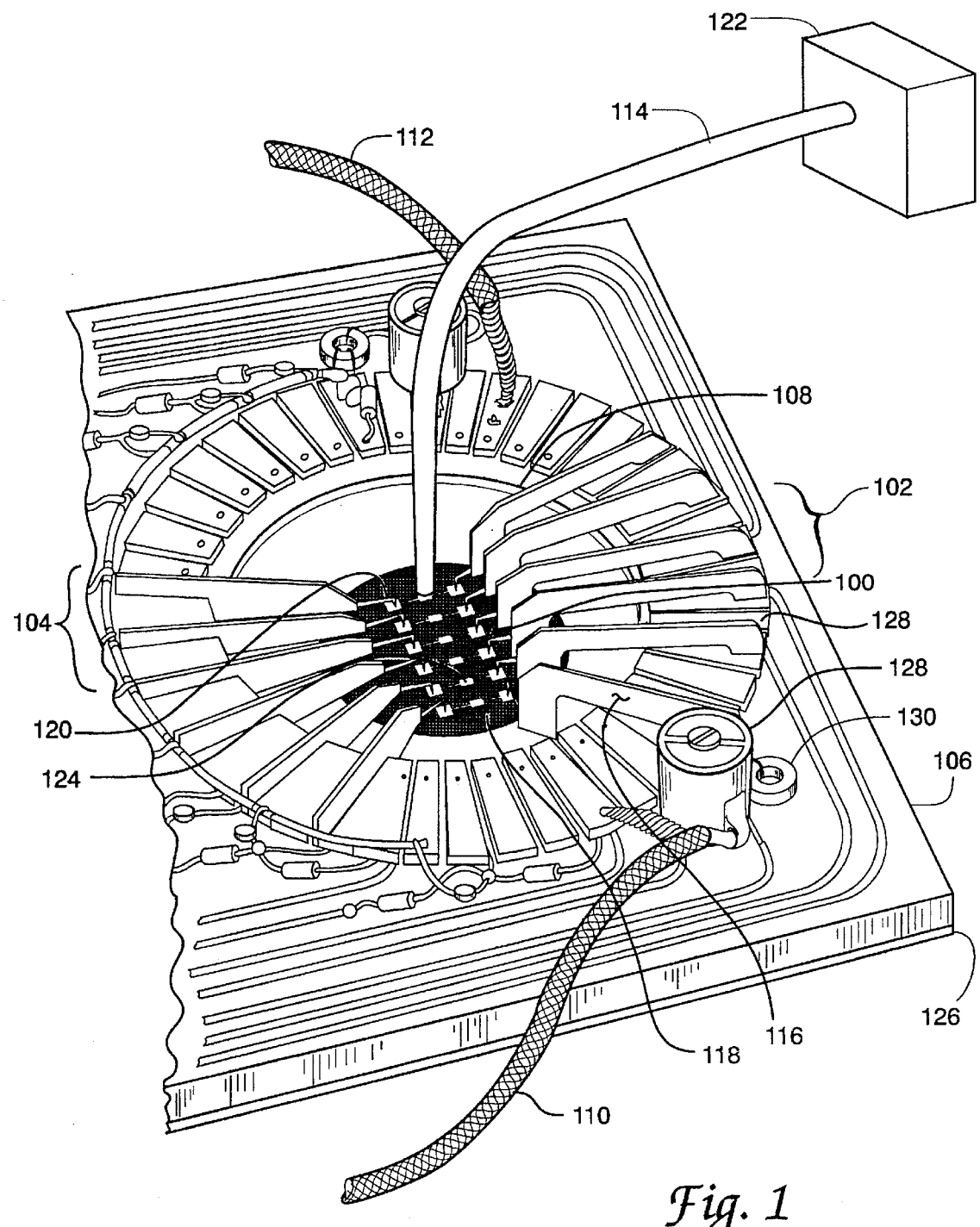
FIG. 1 shows an overall view of an wafer test apparatus which includes test provisions according to the present invention.

Semiconductor material-comprised light detecting optoelectronic devices, devices such as the CCD, the photodiode and the phototransistor are well known in the electronic art; one device of this type, the photodiode, provides a convenient vehicle for describing the present invention. Semiconductor materials are for example the most common material used in the fabrication of certain high speed photo detectors such as those used for fiber-optic systems. These detectors are often fabricated in a fashion similar to that of semiconductor microelectronic circuits, employing thin wafers of diameter between two and ten inches. The individual detector thus fabricated is however, typically only a fraction of a centimeter in length and width and many thousands of detectors can therefore be fabricated simultaneously on a single wafer, a wafer which is subsequently sawed or broken into individual devices.

This sawing and the subsequent packaging is, of course, costly, in both time and materials and desirably avoded in the case of inoperative or marginal circuit die. There is therefore an advantage in accomplishing preliminary but complete die testing in order to sort functional from nonfunctional devices at the earliest practical time in a fabrication process. In the case of electronic devices such as conventional transistors, individual circuits or dice are tested before wafer segregation using a probe station, a station which holds the wafer on a chuck by vacuum attachment, while the circuits are electrically contacted by metal pins or probes that are positioned by micropositioners. As the probe tips and circuit contacts are typically much smaller than a centimeter in size, tip positioning must often be accomplished at least initially using a microscope. Subsequent probe positioning on similar contacts of other circuits on the wafer can be accomplished by computerized positioning systems which use remembered dimensions.

Cost and convenience also cause it to be advantageous to test electro-optical devices in a similar manner. Commonly these devices must however, either receive light from an optical fiber, or transmit light to an optical fiber-since fiber-accomplished communication is a major present-day end use of the fabricated devices. Currently no fully satisfactory means is known to exist for positioning a fiber adjacent a device-under-test at the wafer level with the precision required to simulate actual end use or packaging conditions. This invention provides such means by allowing a testing path optical fiber to be guided and positioned over a device-under-test with great accuracy and yet with a satisfactory degree of repeatability and permanence.

This invention, in its testing of an optical receiver-device usage, therefore provides for positioning, supporting and directing an optical fiber with respect to a semiconductor detector and for communicating an optical signal from an optical source all while the detector remains in the on-wafer, pre-packaged form, and while it is experiencing simultaneous electrical test. The tested detector may of course be surrounded on the wafer by ancillary electrical circuitry such as amplifiers switching circuits and energization circuits and these ancillary circuits can be subjected to simultaneous or supplemental testing while the device-under-test remains captive in a single position.

FIG. 1 of the drawings therefore shows a typical arrangement for the present invention, an arrangement which is based on the inclusion of optical signal capability in, for example, a radio frequency signal-capable probe station. In the FIG. 1 drawing a single circuit die 100 is shown to be located in probing registration position immediately below a probe card 106 with the probe card probe pins, represented typically at 118 and 120, being held in pressured contact with circuit die bonding pads, pads represented by the typical bonding pad 124. Probe pin access to the circuit die 100 is provided by way of a circular aperture 108 which is disposed in the probe card 106; this aperture is surrounded by an array of probe pin-supporting arms as represented typically at 116 and also by the circularly disposed annular ring of probe arm mounting lands indicated at 128.

The FIG. 1 probe card 106 is herein intended to be representative of a wide variety of probe arrangements which may be used in accomplishing electrical test of wafer-mounted circuit die. The particular probe card shown in FIG. 1 is somewhat similar to the arrangement disclosed in U.S. Pat. No. 4,626,775, a patent which is also assigned to the United States Air Force, and is especially arranged to have radio frequency signal communicating capability. The coaxial cable signal paths 110 and 112 together with the radio frequency shield element 126 and other radio frequency components indicated at 128 and 130, for example, contribute to this radio frequency signal communicating capability for the probe card 106. Such radio frequency capability is appropriate for many of the opto-electronic devices tested today since their frequency responses extend well into the Gigahertz range of frequencies. The optical signal provisions afforded by the present invention may of course be employed with the FIG. I radio frequency probe card as well as with digital, analog, electro-optical, D.C. or other types of electrical circuitry probe cards. The optical signals involved may extend from the infrared to the ultraviolet spectral regions with an appropriate selection of fiber-optic conductor materials.

The present invention optical signal communicating apparatus may also be used in probe testing arrangements which are less finalized i.e., more "haywired" than the somewhat optimized arrangement represented in FIG. 1; in such arrangements, as are commonly used in failure analysis or experimental work in an integrated circuit design and fabrication facility, the fixed probe assembly represented by the elements 116 and 118 may be replaced with a portable probe holder or "micromanipulator" and an array of these devices used to accomplish all of the integrated circuit pad connections represented in FIG. 1. Apparatus of this micromanipulator type is available in the commercial marketplace from a number of vendors including Alessi Incorporated of Irvine, Calif.

Single probe micromanipulator devices consist essentially of a weighted base member on which is mounted a two or three orthogonal axis-movable and often electrically insulated probe arm member. The precise position of the probe arm and the attached probe tip is determined at first crudely by manual positioning of the weighted base member and to a greater degree of precision by manual adjustment of two axis or three axis threaded members. In many instances the multiple axis threaded member adjustments are accomplished with the aid of a microscope.

Elements added to the FIG. 1 probe card 106 as part of the present invention are represented at 114 and 122 in the FIG. 1 drawing. These elements add the capability of light or radiant energy (or for purposes of discussion "optical" energy) communication with a signal port located on the wafer 100 in the FIG. 1 testing arrangement. Optical communication with the tested device in FIG. 1, (a device which may be a single opto-electronic transducer such as a photodiode fiber-optic receiver or an integrated circuit which includes a photodiode fiber-optic receiver component for example), can provide an input which results in an electrical potential measurable by way of the electrical probes 118. An optical input signal to the tested device may also comprise a control signal which enables or disables circuitry on the wafer 100 and thereby changes signals detected by the probes 118. Additional details concerning the optical signal elements 114 and 122 are disclosed in connection with the FIG. 2 drawing discussion below.

The FIG. 2 drawing shows a side or cross-section-like view of a portion of the FIG. 1 test arrangement, a view in which the illustrated elements are shown in somewhat larger and schematic-like perspective. Several of the elements shown in the FIG. 2 drawing are directly related to elements appearing in the FIG. 1 drawing and are identified with the same number, a number in the 100 series as is used in the FIG. 1 drawing. These reappearing elements include a portion of the wafer 100, the probe arm 116 and the optical communication elements 114 and 122. The probe arm 116 appears in slightly altered larger form in this FIG. 2 view, a form which is both simplified over the combined elements 116 and 118 represented in FIG. 1 and a form which can have added practical utility in certain probe testing situations.

Elements which first appear in the FIG. 2 drawing are provided with identification numbers in the 200 series; these elements include a representation of the vacuum chuck 200 on which the wafer 100 and the semiconductor circuit device 218 are carried as well as two metal contact portions 204 and 206 of the circuit device 218. Additional elements which first appear in FIG. 2 include an array of parts which attend the optical communications element 114, parts such as the micropositioner controlled probe arm portion at 208, the extension of this arm at 209, and the flexible tubing 216 which covers a lower portion of the optical communication element 114 for protective purposes. Preferably the optical communication element 114 includes a fiber-optic radiant energy conductor, a conductor which has desirable energy transmission characteristics, e.g., low transmission loss, in the band of light or optical frequencies selected for operation of the FIG. 1 and FIG. 2 apparatus.

Coupling of signal between the end of the optical communication element 114, i.e., the optical node at 210 in FIG. 2, and the optical port 203 of the device-under-test can be accomplished in a variety of ways. Successful launch of signal directly from the end of a fiber-optic strand however, requires the presence of a suitable surface at the fiber's end. The invention preferably employs a square cleaved end surface for the fiber of the communications element 114 and uses an atmospheric media coupling path 213 between this cleaved end surface and the input port 203 of the device-under-test. Alternate arrangements of the invention may however employ a rounded termination of the fiber in the communications element 114, and may also employ an anti-reflection coating on the receiving surface of the device-under-test. The invention may also employ an index-matching fluid coupling media in lieu of the atmospheric media path at 213 in FIG. 2. Arrangements such as these can improve the optical energy reflection conditions occurring at the device-under-test terminal ends of the fiber in the communications element 114 and otherwise improve the coupling efficiency between fibers and the port 203. A cleaved fiber surface suitable for use with the invention is obtainable with the use of a York Ultrasonic cleaving tool (the York model FK-11 tool made by York Technology of The United Kingdom may be used) or more simply with a carbide-tipped tubing knife using a degree of care and patience.

When operation in the 1.30 or 1.55 micrometer infrared range of optical signal wavelength is desired for the fiber-optic receiver testing shown in FIG. 2, the optical fiber in the communications element 114 may be made of a material such as silica and may be obtained from suppliers such as Corning Glass Incorporated located in Corning, N.Y The fiber-optic conductor in the communications element 114 may in addition be of the nine micron single mode fiber, the 100 micron graded index fiber or the 140 micron oversize core types of fiber for examples. The fiber selected may have an acrylic or some other exterior coating provided by the manufacturer.

The invention is preferably employed for the communication of conventional or nonpolarized optical signals to a semiconductor device-under-test; however, in instances wherein polarized optical signals are desired in this deviceunder-test, the fiber of the communications element 114 may be provided with an elliptical or noncircular cross sectioned core to assist in transmitted light polarization. Such an individual fiber is represented at 240 in FIG. 2b of the drawings. The fibers at 242 and 244 in the FIG. 2b drawing represent a standard fiber of either the graded or step index type and an oversize core optical fiber respectively; such fibers may also be employed with the apparatus of the invention. Since many of the devices-under-test have an active area of about 50 micrometers by 50 micrometers a large fiber, as shown at 244 in FIG. 2b, may unnecessarily disperse the output energy of the optical signal element 122 and thereby be undesirable. A selection of fiber size in view of device-under-test active area may be desirable in some instances.

Also appearing in the FIG. 2 drawing is a rigid sleeve member 212 which is attached to the probe arm extension 209 for the purpose of retaining the optical communications element 114 in position; this sleeve element is connected by the flexible material 217 to the optical communications element 114. The flexible material 217, as is better shown in the enlarged cross section view of FIG. 2a, may be Silicone Rubber or the like; the rigid sleeve member 212 may be fabricated from a medical syringe tip or the like.

The multiple axis positioning apparatus portion of the micropositioner which carries the probe arm portion at 208 is represented at 215 in FIG. 2. As shown in this representation, this apparatus consists of the orthogonally disposed threaded members 222, 226 and 232 and the rigidly mounted thread follower or nut elements 220, 228 and 234. Each of the thread follower elements 220, 228 and 234 is joined by one of the connections 224, 230 and 236 to a portion of the probe arm portion 208. The orthogonally disposed threaded members 222, 226 and 232 together with the remainder parts of the apparatus at 215 provide vernier control of probe arm portion 208 after a gross position has been established by, for example, manual positioning of the probe base or by attachment of the probe parts to the probe card 106. It is significant to note, however, that once a position is established for the optical node 210 located at the end of the optical fiber comprising the optical communications element 114, this position remains fixed with respect to other parts of the probe apparatus and will access the same area of any similar circuit device that is brought into the desired registration position, the position of the circuit 218 in FIG. 2. Movement of either the wafer or the probe apparatus or both may be, of course, used to access different devices on a wafer.

The optical port portion of the integrated circuit 100 is represented at 203 in the FIG. 2 drawing; by way of the multiple axis positioning apparatus at 215 the optical energy communicating node 210 may be disposed in any orientation and as close as needed with respect to this port. In instances which employ the above identified 1.30 or 1.55 micrometer wavelength optical energization, alignment of node 210 and port 203 may require at least a one time electrical signal strength measurement for optimization since the infrared energy of this wavelength is not visible to the eye. Although not shown in the FIG. 1 and FIG. 2 drawings the orientation of the device-under-test end of the optical communications element 114 can desirably be disposed in a plane that is nonparallel with the wafer 100 when desired. Such a nonorthogonal disposition is, for example, useful in instances wherein the port 203 is itself not disposed parallel with the wafer 100 but rather oriented angularly for off axis end use accommodation purposes.

In instances wherein the port 203 provides an optical energy input to the wafer 100, the apparatus within the optical communication element 122 at the sending end of the fiber will necessarily include an electrical to optical transducer element such as a solid state laser or a monochrometer in order to generate the optical signals communicated along the element 114. Optical signal generating apparatus of the solid state laser type, apparatus capable of response to the pulses, amplitude changes and other modulations imposed by a semiconductor device test apparatus are available in the commercial marketplace. A laser diode such as the model LD-10H made by Newport Corporation of Fountain Valley, Calif. may be used as an internal component of the optical communication element 122. A monochrometer such as the Spectrapro-150 made by Acton Research Corporation of Acton, Mass. may also be used as the optical communication element 122 or as an internal component of the optical communication element 122.

In the case of both the laser and monochrometer sources of optical energy it is desirable for the optical energy source to be responsive to a variety of modulation waveforms and frequencies in order to enable flexible control of the testing process from software resident in a controlling computer, the same computer which receives the electrical output signals generated by optical and electrical test signals applied to the device-under-test. From this perspective, therefore, the signal communicating capability of the FIG. 1 and FIG. 2 apparatus may be viewed as a wideband optical link in a closed loop computer controlled test environment for an opto-electronic device such as a fiber-optic photodiode.

Figure 3:
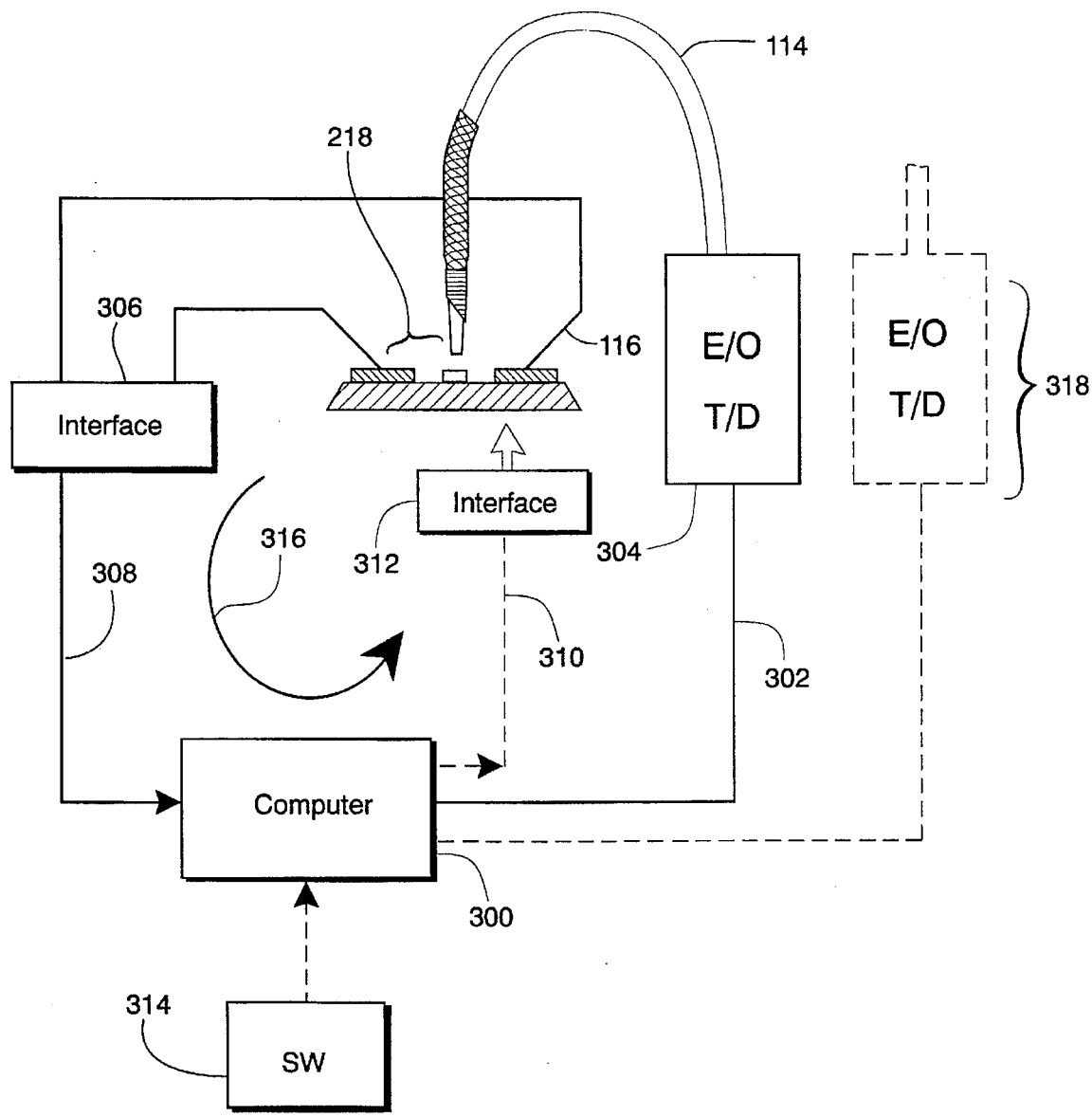
FIG. 3 shows a closed loop semiconductor device test arrangement according to the invention.

A representation of such a closed loop optical link-inclusive testing apparatus is shown in FIG. 3 of the drawings where the device-under-test circuit device 218 is shown to reside within the computerized closed testing loop generally indicated at 316. In this closed loop the computer 300 provides optical input to the circuit device 218 by way of the electro-optical transducer 304 and the optical communications element 114. Electrical energization and electrical signals are also provided to the circuit device 218 by way of signal interface circuits 312 and the path 310, the latter elements being shown in dotted form to indicate their optional or not always needed status. Output signals from the circuit device 218, the device-under-test, are returned to the computer 300 by way of the probes 116, the second signal interface circuits 306 and the path 308. The software which is used to determine the nature of the signals and energization applied to the circuit device 218 and to receive and evaluate the signal output from the device-under-test circuit device 218 is indicated at 314 in FIG. 3.

Computerized semiconductor test apparatus of the type shown in FIG. 3 is available in the commercial marketplace; vendors such as The Terradyne Corporation, The Fairchild Camera and Instrument Corporation and Hewlett Packard Corporation of Palo Alto, Calif. are sources of such equipment. The software indicated at 314 in FIG. 3 is, of course, specialized according to the testing equipment used and the specific tests to be accomplished on the circuit device 218; generally persons skilled in the semiconductor device art are believed to be knowledgeable of the FIG. 3 type of equipment and its software protocol and this software is deemed not to be a part of the present invention. Identification and remembering of test results may be accomplished in the memory of the computer 300. Application of a plurality of optical test signals to the device-under-test circuit device 218 may be accomplished with a second or additional apparatus of the 302, 304 and 114 type as is indicated at 318 in FIG. 3.

A variation of the present invention can be achieved by providing a plurality of the FIG. 1 and FIG. 2 optical energy sources in a testing environment and endowing each of these sources with different output signal characteristics, a different spectral band or a different signal modulation for example. In such an "interchangeable fiber tips" arrangement of the invention, as is represented in FIG. 3 of the drawings, the device-under-test can be exposed to each optical signal in sequence by either manual or automated displacements of the optical node with respect to the optical port elements. A multiple signal arrangement of this type can be especially useful for examples in accomplishing device-under-test responsivity, pulse response and frequency response measurements in a single test or combined test arrangement.

Even though the present invention is capable of optical communication with an opto-electronic device disposed in wafer form (or in fact in any other exposed surface state of fabrication), persons skilled in the semiconductor device art will perhaps be little surprised that a particularly useful employment of the invention arises in testing full wafers of e.g., gallium arsenide-comprised photodiode fiber-optic receiving elements of the fiber bonded detector type, testing prior to a scribe and break or other die segregation operation. In this receiver setting the utility of the disclosed testing arrangement can perhaps be better appreciated by realizing that prior to the invention, it was often necessary to either flood an area of a wafer to achieve optical input to receiver devices or alternately to attach a light conducting pigtail to the optical input node of each receiver device and optically energize the distal end of this pigtail from a source such as a light emitting diode or a laser. Flooding for this purpose is most readily accomplished with a laser diode; however, at the more useful wavelengths for fiber-optic receiver devices, the identified wavelengths of 1.3 and 1.55 micrometers for examples, laser diodes may not generate enough power to fully activate the sensitive region of a detector when used in such a flooding mode of operation. With the fiber-optic pigtail technique, measuring different devices requires the bonding of a different fiber to each individual device to be tested, a procedure which is tedious, time consuming, costly, and perhaps harmful to the tested devices.

The ability to selectively energize single receiver devices is also found to be of significant advantage in device testing since less optical energy is needed, fast operating speeds or data rates are more easily maintained and having the ability to pick and choose the region to be tested is a desirable measurement addition. The present invention fiber probe is also closer to simulating the actual application environment of the receiver device-under-test i.e., the fiber bonded detector. In particular, the radiation pattern of light emerging from a fiber-optic communication link is found to significantly influence receiver device performance; the arrangement of the present invention is therefore more realistic in simulating actual use conditions.

The testing arrangement of the present invention is also found to be desirable in enabling the use of standard electrical probe test equipment in the testing of opto-electronic devices. The additional apparatus required for the present invention testing, as may be appreciated from the FIG. 1, FIG. 2 and FIG. 3 drawings herein, is sufficiently small and portable as to enable its addition to existing laboratory or production probe apparatus with ease. With the addition of apparatus according to the invention the frequently encountered electrical probe station is provided with capability of performing a combined electrical and optical input test on a light responsive device-under-test. Notably this test may be of either a simple nature or a complex and computer controlled nature, involving the combination of modulated optical and electrical signals.

While the apparatus and method herein described constitute a preferred embodiment of the invention, it is to be understood that the invention is not limited to this precise form of apparatus or method and that changes may be made therein without departing from the scope of the invention which is defined in the appended claims.

What is claimed is:

1. The method of probe testing integral wafer-contained fiber-optic receiver photodiode inclusive circuit die comprising the steps of:

disposing a to-be-tested integral wafer-contained fiber-optic receiver photodiode inclusive circuit die into engagement with an array of precisely positioned electrical probe elements located around a circuit die-receiving aperture of a probe card test apparatus;

energizing said to be tested circuit die electrically through said array of electrical probe elements as required for functional operation;

supplying electrical input port signals and electrical output port loading to said circuit die through said array of electrical probe elements as needed for functional operation;

disposing an external signal-communicating optical node in a remembered precise physical position location and orientation with respect to said array of electrical probe elements, said circuit die-receiving aperture and a selected optical input port region of said to-be-tested circuit die;

communicating optical energy signals from a testing apparatus-energized external transducer element through a fiber-optic communication path element to said optical node and thence by a short media path to said optical input port region of said to-be-tested circuit die;

controlling an optical signal communicated between said external transducer apparatus and said circuit die optical port from within said testing apparatus;

evaluating electrical signals communicated from said circuit die to said testing apparatus via said array of electrical probe elements, in response to received optical and electrical signals, against expected die performance criteria;

moving said aperture and said wafer with respect to each other until a next to be tested circuit die on said wafer is precisely located within said aperture and in physical registration with said electrical probe elements and said signal-communicating optical node.

2. The method of probe testing of claim 1 wherein said step of communicating optical energy signals from a testing apparatus-energized external transducer element through a fiber-optic communication path element to said optical node and thence by a short media path to said optical input port region of said to-be-tested circuit die includes communicating infrared optical signals from said optical node through an exclusively atmospheric media path to said optical input port.

3. The method of probe testing of claim 2 wherein said to be tested circuit die is an electrically passive photodiode element without attending transistor electrical circuits and said as required for functional operation electrical energization is zero.

4. The method of probe testing of claim 1 wherein said to be tested circuit die is an electrically passive photodiode element without attending transistor electrical circuits and said as needed for functional operation electrical input port signals and electrical output port loading are zero and an open circuit respectively.

5. The method of probe testing of claim 1 wherein said to be tested circuit die includes an electrically passive photodiode element and transistor electrical circuits connected therewith and said as required for functional operation electrical energization is of nonzero magnitude.

6. The method of probe testing of claim 1 wherein said step of moving said aperture said integrated circuit wafer with respect to each other until a next to be tested circuit die on said wafer is precisely located within said aperture in physical registration with said electrical probe elements and said signal-communicating optical node, includes moving said wafer with respect to a fixed position location of said aperture.

7. The method of probe testing of claim 1 wherein said step of controlling an optical signal communicated between said external transducer apparatus and said integrated circuit device optical port from within said testing apparatus includes executing computer software resident within said testing apparatus.

8. The method of probe testing of claim 1 wherein said circuit die comprises a two electrical terminal fiber-optic receiver transducer and said array of precisely positioned electrical probe elements disposed around an integrated circuit die-receiving aperture of a testing apparatus is comprised of two electrical probe elements.

9. The method of probe testing integral semiconductor wafer-contained optically polarized fiber-optic receiver photodiode and attending electrical circuits-inclusive device-under-test circuit die comprising the steps of:

disposing a device-under-test circuit die into engagement with an array of precisely positioned electrical probe elements located around a circuit die-receiving aperture of a probe card test apparatus;

energizing said attending electrical circuits of said device-under-test circuit die electrically through said array of electrical probe elements;

supplying electrical input port signals and electrical output port loading to said device-under-test circuit die through said array of electrical probe elements as needed for functional operation;

disposing an external signal-communicating optical node in a precise physical position location and orientation with respect to said array of electrical probe elements, said circuit die-receiving aperture and a polarized optical input signal port region of said device-under-test circuit die;

transmitting polarized optical energy signals from a computerized testing apparatus-controlled monochrometer optical signal source through a fiber-optic communication path of elliptically cross-sectioned polarizing optical fiber to said optical node;

communicating polarized optical energy signals from said optical node through an intervening media path to said polarized optical input signal port region of said to-be-tested circuit die;

communicating electrical output signals of said device-under-test circuit die to an input port of said computerized testing apparatus;

said communicating step completing a closed loop optical signal path-inclusive testing loop comprising said computerized testing apparatus and said device-under-test circuit die;

controlling an optical signal communicated between said external transducer apparatus and said circuit die optical port from software executing within said computerized testing apparatus;

evaluating electrical signals communicated from said device-under-test circuit die to said computerized testing apparatus against expected device-under-test circuit die performance criteria;

identifying said device-under-test circuit die according to a results of said evaluating step;

moving said aperture and said device-under-test wafer of circuit die with respect to each other until a next to be tested circuit die on said wafer is precisely located within said aperture and in physical registration with said electrical probe elements and said signal-communicating optical node.

10. The method of probe testing of claim 9 wherein said step of communicating polarized optical energy signals comprises one of the steps of:

communicating optical energy signals through an ambient atmosphere path;

communicating optical energy signals through an anti-reflection coating received over said polarized optical input signal port region of said to-be-tested circuit die;

communicating optical energy signals through an optical index matching fluid;

communicating optical energy signals through a rounded end portion of said fiber-optic communication path optical fiber; and communicating optical energy signals through a cleaved end surface portion of said fiber-optic communication path optical fiber.

11. The method of probe testing of claim 9 wherein said step of communicating polarized optical energy signals comprises the combination of:

communicating optical energy signals through an anti-reflection coating received over said polarized optical input signal port region of said to-be-tested circuit die; and communicating optical energy signals through an ambient atmosphere path.

12. The method of probe testing of claim 10 wherein said step of communicating polarized optical energy signals comprises the combination of:

communicating infrared optical energy signals through a rounded end portion of said fiber-optic communication path optical fiber; and communicating optical energy signals through an ambient atmosphere path.

13. The method of probe testing of claim 10 wherein said step of communicating polarized optical energy signals comprises the combination of:

communicating infrared optical energy signals through an anti-reflection coating received over said polarized optical input signal port region of said to-be-tested circuit die; and communicating infrared optical energy signals through an optical index matching fluid.

14. The method of probe testing of claim 10 wherein said step of communicating polarized optical energy signals comprises:

communicating infrared optical energy signals through an ambient atmosphere path.

15. The method of probe testing of claim 10 wherein said step of communicating polarized optical energy signals comprises:

communicating infrared optical energy signals through an optical index matching fluid; and communicating infrared optical energy signals through a rounded end portion of said fiber-optic communication path optical fiber.

16. The method of probe testing of claim 11 further including the step of communicating a sequential plurality of said polarized optical energy signals from a plurality of said optical nodes through intervening media paths to said polarized optical input signal port region of said to-be-tested circuit die.

17. The method of probe testing of claim 16 wherein said polarized optical energy signals are signals having one of the wavelengths of 1.30 and 1.55 micrometers.

18. The method of probe testing of claim 17 wherein said step of communicating a sequential plurality of said polarized optical energy signals from a plurality of said optical nodes through intervening media paths to said polarized optical input signal port region of said to-be-tested circuit die comprises a combination of a responsivity, a pulse response and a frequency response measurement tests.

* * * * *